(12) United States Patent
Dong et al.

(10) Patent No.: US 10,948,951 B2
(45) Date of Patent: Mar. 16, 2021

(54) CARD/CHASSIS COUPLING SYSTEM

(71) Applicant: Dell Products L.P., Round Rock, TX (US)

(72) Inventors: Wei Dong, Shanghai (CN); Haifang Zhai, Shanghai (CN); Xiaoping Wu, Shanghai (CN); Yujie Zhou, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/779,308

(22) Filed: Jan. 31, 2020

(65) Prior Publication Data
US 2021/0034120 A1 Feb. 4, 2021

(30) Foreign Application Priority Data
Aug. 2, 2019 (CN) .......................... 201910711756.X

(51) Int. Cl.
*G06K 13/08* (2006.01)
*G06F 1/18* (2006.01)
*H05K 5/02* (2006.01)

(52) U.S. Cl.
CPC ......... *G06F 1/186* (2013.01); *G06K 13/0806* (2013.01); *H05K 5/0295* (2013.01); *G06K 13/0812* (2013.01); *G06K 13/0831* (2013.01)

(58) Field of Classification Search
CPC .......... G06K 13/0806; G06K 13/0831; G06K 13/08; G06K 13/085; G06K 7/0034; G06F 1/186; G06F 1/187; G06F 1/183; H05K 5/0295; H05K 7/1411; H05K 7/1489; H05K 7/1409; H05K 7/1454; H01R 13/62; H01R 13/633
See application file for complete search history.

(56) References Cited

U.S. PATENT DOCUMENTS

| | | | | |
|---|---|---|---|---|
| 4,383,453 A | * | 5/1983 | Lehmann | H01H 19/003 74/128 |
| 4,952,161 A | * | 8/1990 | Komatsu | H01R 12/7005 439/155 |
| 5,299,089 A | * | 3/1994 | Lwee | G06F 1/184 361/679.33 |
| 5,316,488 A | * | 5/1994 | Gardner | G06K 13/08 439/79 |

(Continued)

*Primary Examiner* — Binh B Tran
*Assistant Examiner* — Michael A Matey
(74) *Attorney, Agent, or Firm* — Haynes and Boone, LLP

(57) ABSTRACT

A card/chassis coupling system includes a chassis defining a chassis housing with a chassis wall defining a card entrance to the chassis housing. The chassis wall engages a securing element on a card to secure it in the chassis housing. A card/chassis release device adjacent the card entrance includes a base in the chassis housing, and a card mover member and securing element release member that are each moveably coupled to the base and to an actuator member extending through the chassis wall. Movement of the actuator member into the chassis housing causes the securing element release member to move relative to the base to engage the securing element on the card and disengage it from the chassis wall, and causes the card mover member to move relative to the base to engage the card and move it through the card entrance and out of the chassis housing.

20 Claims, 12 Drawing Sheets

(56) References Cited

U.S. PATENT DOCUMENTS

| | | | | |
|---|---|---|---|---|
| 5,443,395 | A * | 8/1995 | Wang | H05K 5/0295 |
| | | | | 439/159 |
| 5,492,480 | A * | 2/1996 | Fusselman | G06K 13/08 |
| | | | | 439/157 |
| 5,793,607 | A * | 8/1998 | Karidis | G06F 1/1616 |
| | | | | 361/679.38 |
| 5,917,795 | A * | 6/1999 | Furukawa | G11B 33/121 |
| | | | | 360/99.06 |
| 6,595,425 | B1 * | 7/2003 | Ito | G06K 13/08 |
| | | | | 235/486 |
| 8,231,394 | B2 * | 7/2012 | Takao | G06K 13/08 |
| | | | | 439/159 |
| 2004/0140359 | A1 * | 7/2004 | Learmonth | G06K 13/08 |
| | | | | 235/441 |
| 2007/0134959 | A1 * | 6/2007 | Hsiao | G06K 7/0034 |
| | | | | 439/159 |
| 2015/0359125 | A1 * | 12/2015 | Ehlen | H05K 7/1409 |
| | | | | 361/754 |
| 2016/0380385 | A1 * | 12/2016 | Heiskanen | H01R 13/6335 |
| | | | | 439/160 |

* cited by examiner

CARD/CHASSIS COUPLING SYSTEM

CROSS-REFERENCE TO RELATED APPLICATION

This application claims priority to Chinese Application Serial No. 201910711756.X, filed Aug. 2, 2019, the disclosure of which is incorporated herein by reference in its entirety.

BACKGROUND

The present disclosure relates generally to information handling systems, and more particularly to coupling cards to an information handling system chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, storage devices, and/or other computing devices known in the art, sometimes utilize cards in order to expand the functionality of those computing devices. For example, the Open Compute Project (OCP) is an industry trade group created for the purposes of sharing designs of data center products, and has proposed a Network Interface Controller (NIC) 3.0 mezzanine card that is configured to secure to the computing device chassis via either a thumb screw that is included on the card and that is configured to engage and secures to an outer surface of the chassis, or a tool-less latch that engages both the outer surface of the chassis and the card. However, the thumb screw securing feature on such cards can be difficult to unscrew in many situations, as the thumb-screw is relatively small and can be difficult to access in dense computing device environments that introduce cables and/or other obstructions to the thumb screw. Furthermore, the tool-less latch securing feature on such cards occupies space in front of the card entrance to the chassis, which can make it difficult to provide the card in the chassis and/or remove the card from the chassis, particularly in the dense computing device environments discussed above.

Accordingly, it would be desirable to provide a card/chassis coupling system that addresses the issues discussed above.

SUMMARY

According to one embodiment, an Information Handling System (IHS) includes a chassis defining a chassis housing; a processing system that located in the chassis housing; a chassis wall that is included on the chassis and that defines a card entrance to the chassis housing; a card that is located in the card housing and coupled to the processing system, wherein the chassis wall engages a first securing element on the card to secure the card in the chassis housing; and a first card/chassis release device that is located adjacent the card entrance, wherein the first card/chassis release device includes: a first base that is located in the chassis housing; a first card mover member that is movably coupled to the first base; a first securing element release member that is moveably coupled to the first base adjacent the first card mover member; and a first actuator member that is coupled to each of the first card mover member and the first securing element release member, wherein the first actuator member extends through the chassis wall and is configured, in response to a first force that moves the first actuator member into the chassis housing, to: first cause the first securing element release member to move relative to the first base and into engagement with the first securing element on the card such that the first securing element disengages the chassis wall; and then cause the first card mover member to move relative to the first base and into engagement with the card to move the card through the card entrance and out of the chassis housing.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
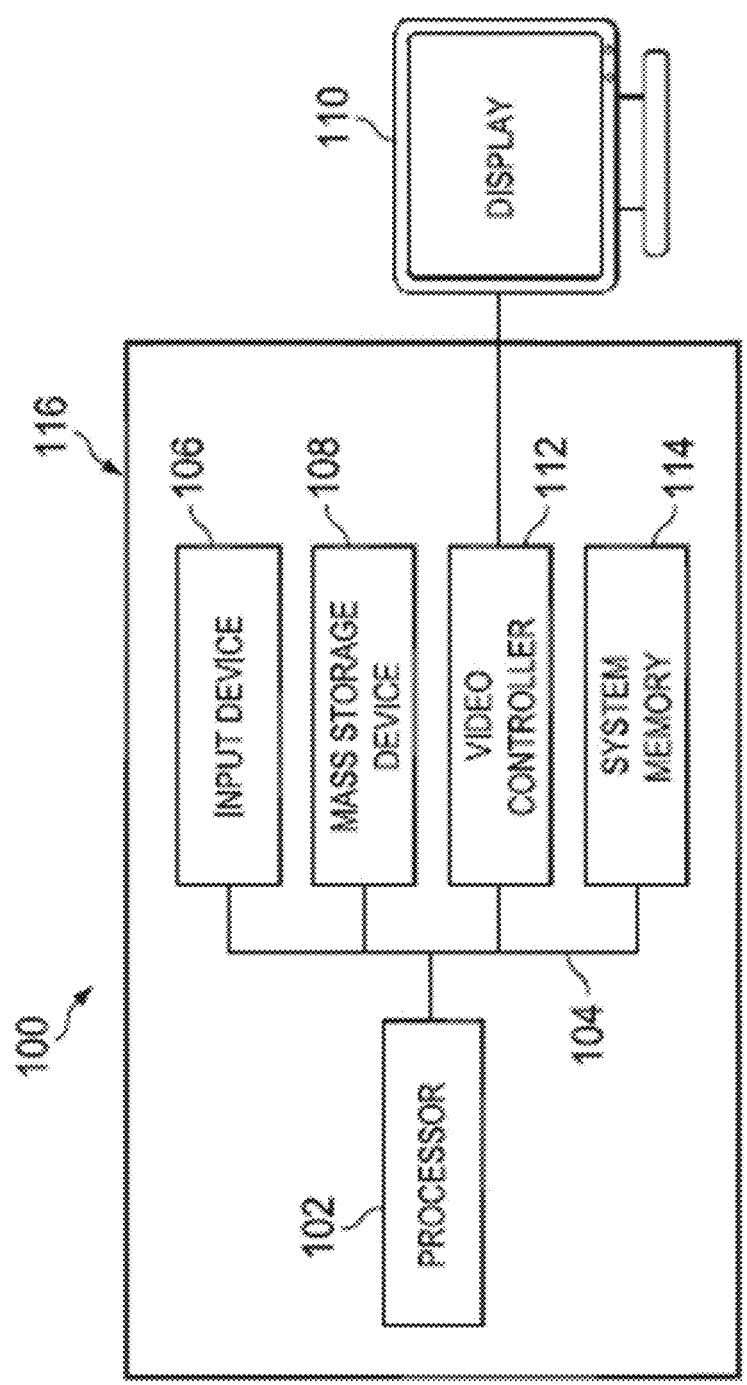
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
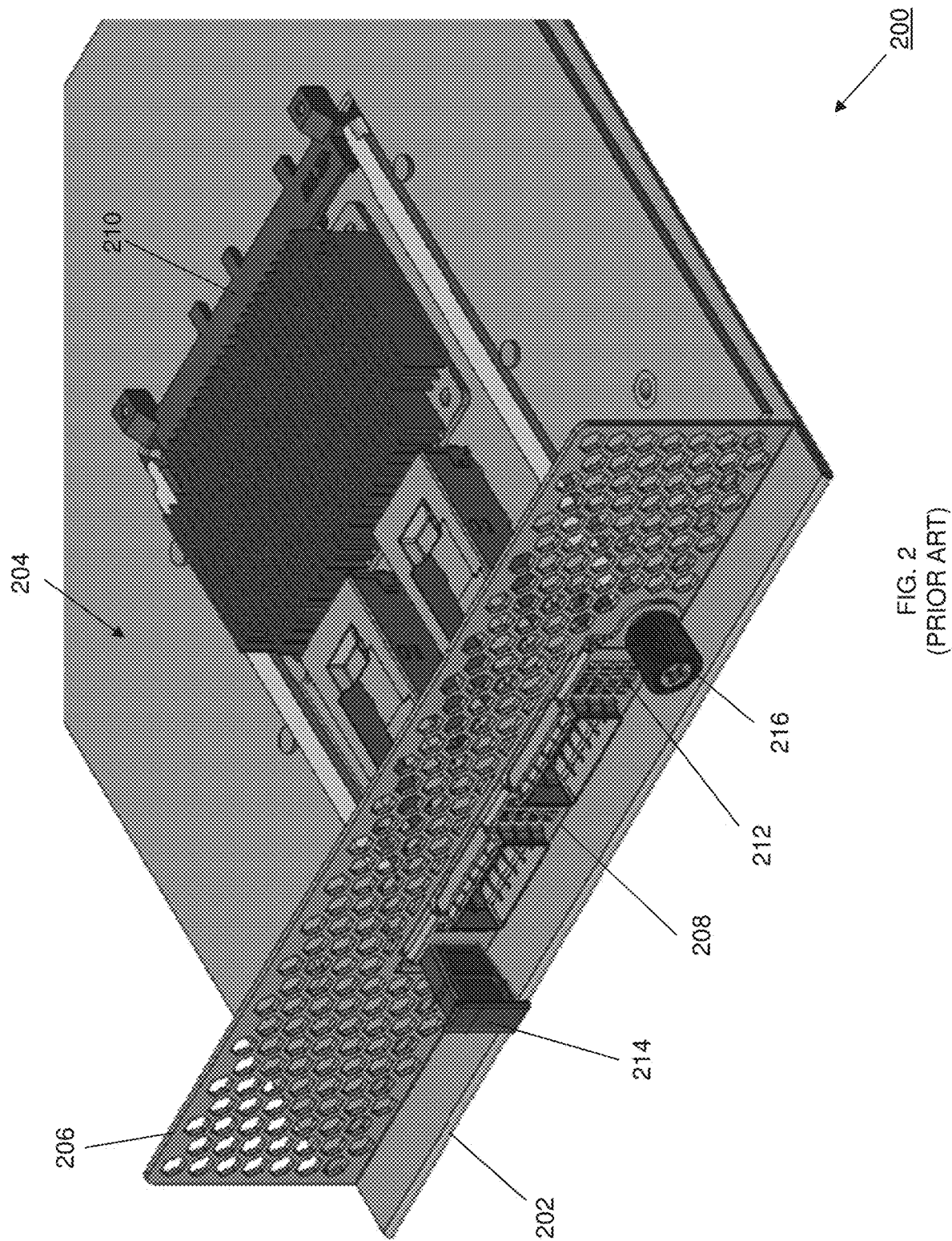
FIG. 2 is a perspective view illustrating an embodiment of conventional card/chassis coupling system.
Figure 3:
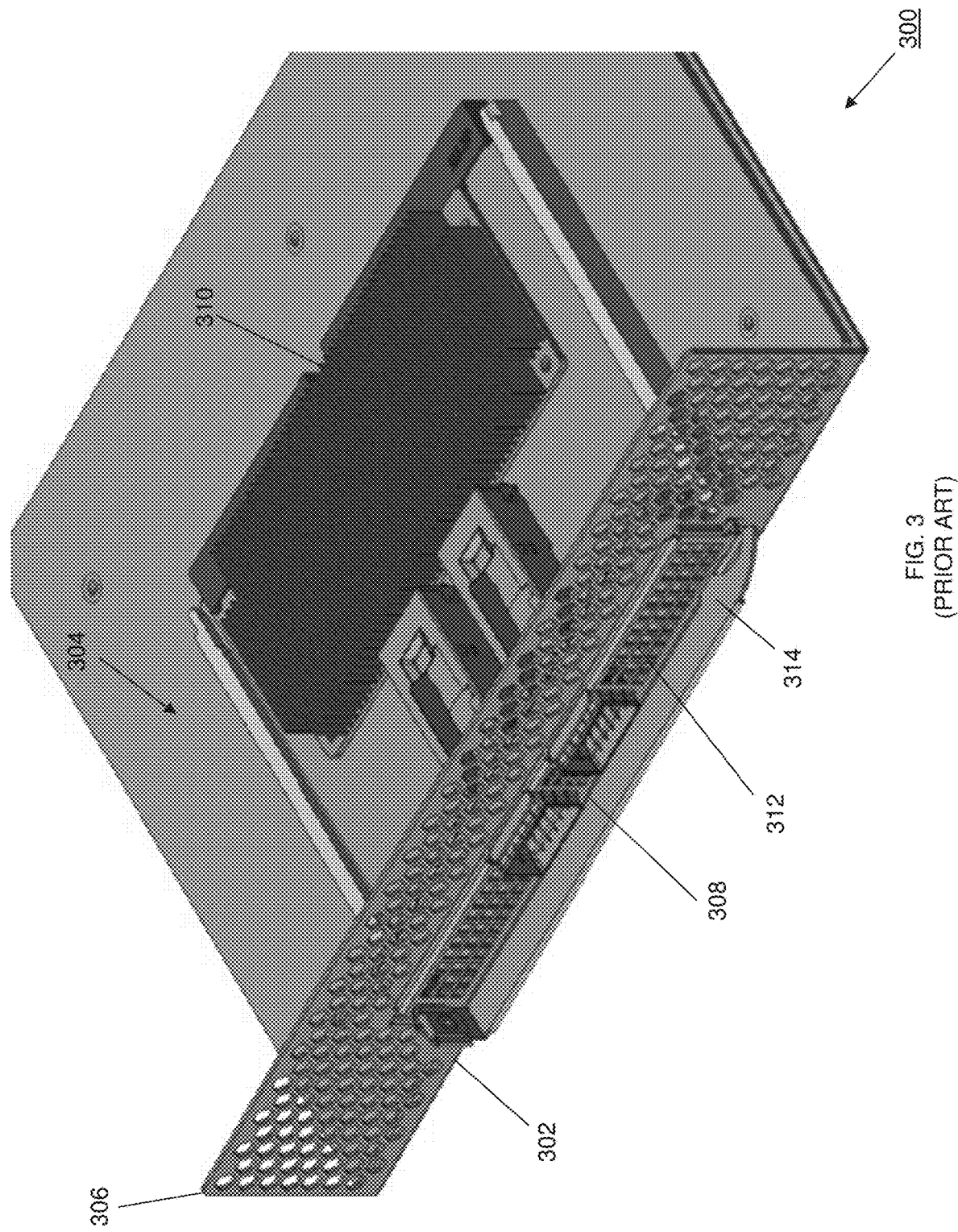
FIG. 3 is a perspective view illustrating an embodiment of conventional card/chassis coupling system.

With reference to FIGS. 2 and 3, conventional card/chassis coupling systems 200 and 300 are illustrated and discussed below to provide an example of some benefits that may be realized from the teachings of the present disclosure. However, while specific conventional systems and improvements from those systems are illustrated and described below, one of skill in the art in possession of the present disclosure will recognize that the teachings of the present disclosure may provide benefits to a variety of card/chassis coupling systems know in the art while remaining within the scope of the present disclosure as well. With reference to the conventional card/chassis coupling system 200 illustrated in FIG. 2, a chassis 202 is illustrated that defines a chassis housing 204. A chassis wall 206 on the chassis 202 defines a card entrance 208 that extends through the chassis wall 206 to the chassis housing 204. A card 210 is located in the chassis housing 204, and as will be appreciated by one of skill in the art in possession of the present disclosure, the card 210 may have been moved through the card entrance 208 and into the chassis housing 204 to the position illustrated in FIG. 2. A front surface 212 of the card 210 includes a handle 214 and a thumb screw 216 that are located on opposite sides of the front surface 212, and one of skill in the art in possession of the present disclosure will appreciate that once the card 210 is positioned in the chassis housing 204 as illustrated in FIG. 2 (e.g., via the handle 214), the thumb screw 216 may engage a threaded aperture on the chassis wall 206 to secure the card 210 in the chassis housing 204. However, as discussed above, the thumb screw 216 can be difficult to unscrew in many situations, as the thumb screw 216 is relatively small and can be difficult to access in dense computing device environments that introduce cables and/or other obstructions to the thumb screw 216.

With reference to the conventional card/chassis coupling system 300 illustrated in FIG. 3, a chassis 302 is illustrated that defines a chassis housing 304. A chassis wall 306 on the chassis 302 defines a card entrance 308 that extends through the chassis wall 306 to the chassis housing 304. A card 310 is located in the chassis housing 304, and as will be appreciated by one of skill in the art in possession of the present disclosure, the card 310 may have been moved through the card entrance 308 and into the chassis housing 304 to the position illustrated in FIG. 3. A front surface 312 of the card 310 includes a tool-less latch 314 coupled to the front surface 312, and one of skill in the art in possession of the present disclosure will appreciate that once the card 310 is positioned in the chassis housing 304 as illustrated in FIG. 3, the tool-less latch 314 may be secured on the chassis wall 306 to secure the card 310 in the chassis housing 304. However, as discussed above, the tool-less latch 314 occupies space in front of the card entrance 308 to the chassis housing 304, which can make it difficult to provide the card 310 in the chassis 302 and/or remove the card 310 from the chassis 302, particularly in the dense computing device environments discussed above.

Figure 4A:
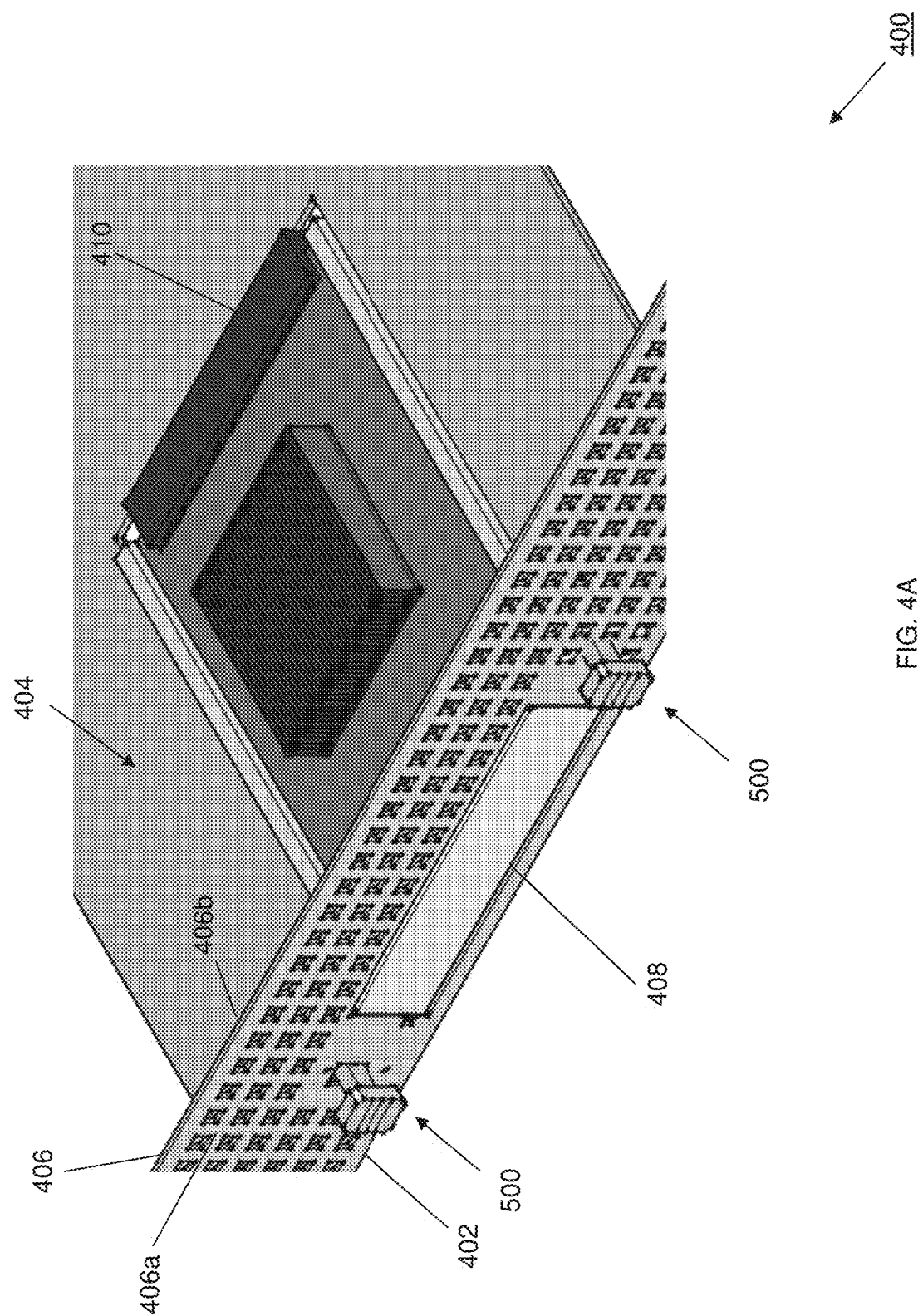
FIG. 4A is a perspective view illustrating an embodiment of a card/chassis coupling system according to the teachings of the present disclosure.

Referring now to FIG. 4A, an embodiment of a card/chassis coupling system 400 according to the teachings of the present disclosure is illustrated. In the illustrated embodiment, the card/chassis coupling system 400 incudes a chassis 402 that defines a chassis housing 404. A chassis wall 406 on the chassis 402 includes an outer surface 406a, an inner surface 406b that is located opposite the chassis wall 406 form the outer surface 406a, and defines a card entrance 408 that extends through the chassis wall 406 to the chassis housing 404. A card 410 is located in the chassis housing 404, and in the examples below is provided by an OCP Network Interface Controller (NIC) 3.0 card, although one of skill in the art in possession of the present disclosure will recognize that a variety of other cards will benefit from the teachings of the present disclosure and thus are envisioned as falling within the scope of the present disclosure as well.

Figure 4B:
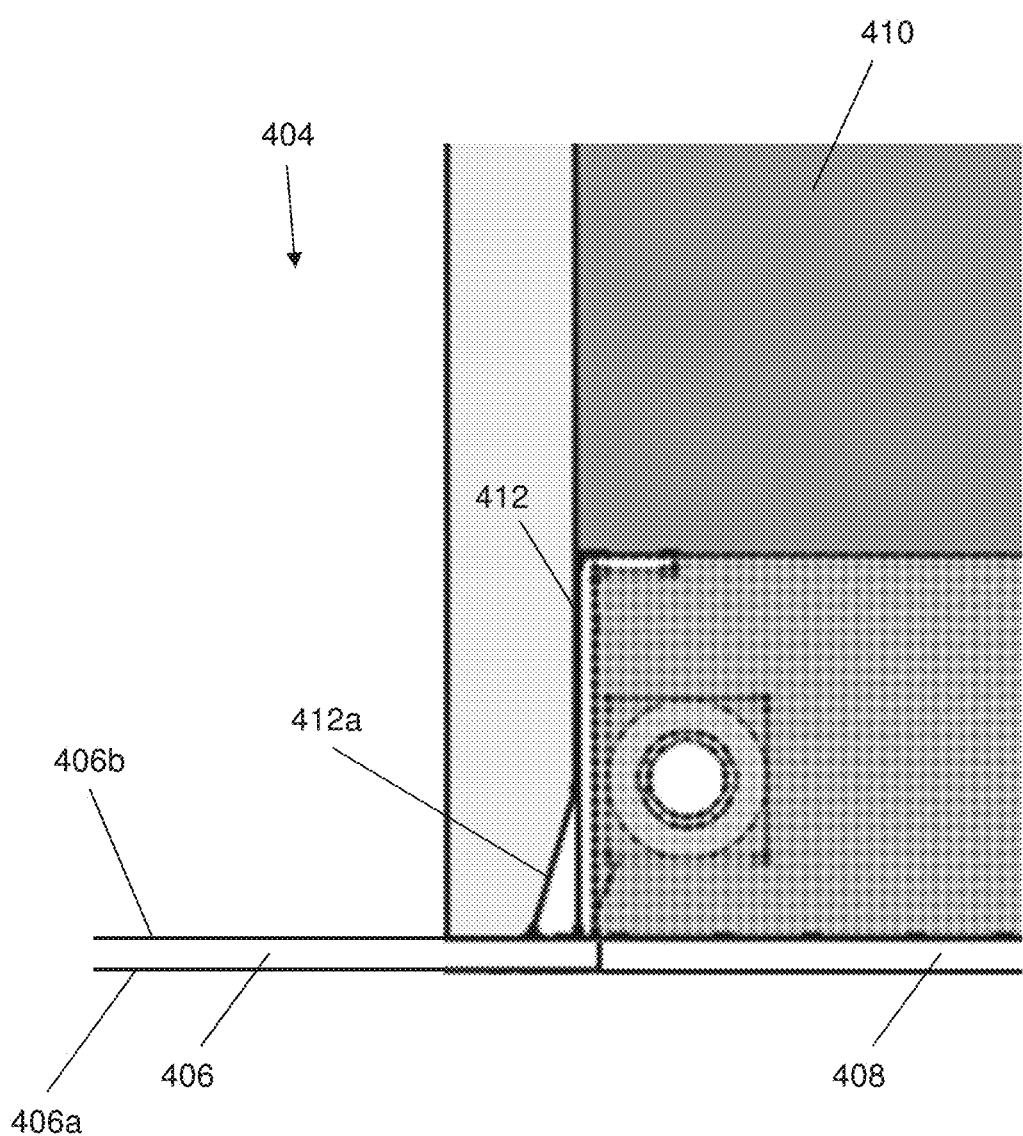
FIG. 4B is a top view illustrating an embodiment of a securing feature that is included on a card in the card/chassis coupling system of FIG. 4A and that is engaging a chassis in the card/chassis coupling system of FIG. 4A.

FIG. 4B illustrates a view of the card 410 positioned in the chassis housing 404 such that a securing element 412 on the card 410 engages the chassis wall 406. As will be appreciated by one of skill in the art in possession of the present disclosure and as discussed in further detail below, the card 410 may have been moved through the card entrance 408 and into the chassis housing 404 to the position illustrated in FIGS. 4A and 4B, and the movement of the card 410 though the card entrance 408 and into the chassis housing 404 causes a securing element engagement member 412a on a securing element 412 that is included on the card 410 to engage the chassis wall 406 and deflect the securing element 412 from an undeflected orientation and into a deflected orientation that allows the securing element engagement member 412a to pass through the card entrance 408, discussed in further detail below. When the movement of the card 410 though the card entrance 408 and into the chassis housing 404 positions the securing element engagement member 412a past the chassis wall 406 and entirely in the chassis housing 404, the securing element 412 will deflect back into the undeflected orientation such that the securing element engagement member 412a engages the chassis wall 406 to secure the card 410 in the chassis housing 404, as illustrated in FIG. 4B.

While a single securing element 412 is illustrated engaging the chassis wall 406 on a first side of the chassis entrance 408, one of skill in the art in possession of the present disclosure will recognize that another securing element on the card 410 may engage the chassis wall 406 on a second side of the chassis entrance 408 that is opposite the chassis entrance from the first side illustrated in FIG. 4B while remaining within the scope of the present disclosure as well. For example, FIG. 4A illustrates a pair of card/chassis release devices 500 provided on opposite sides of the card entrance 408 that may interact with first and second securing elements on the card 410, and those card/chassis release devices 500 are described in further detail below with reference to FIG. 5. While a specific card/chassis coupling system 400 has been illustrated and described, one of skill in the art in possession of the present disclosure will recognize that the card/chassis coupling system 400 of the present disclosure may include a variety of components and component configurations while remaining within the scope of the present disclosure as well.

Figure 5A:
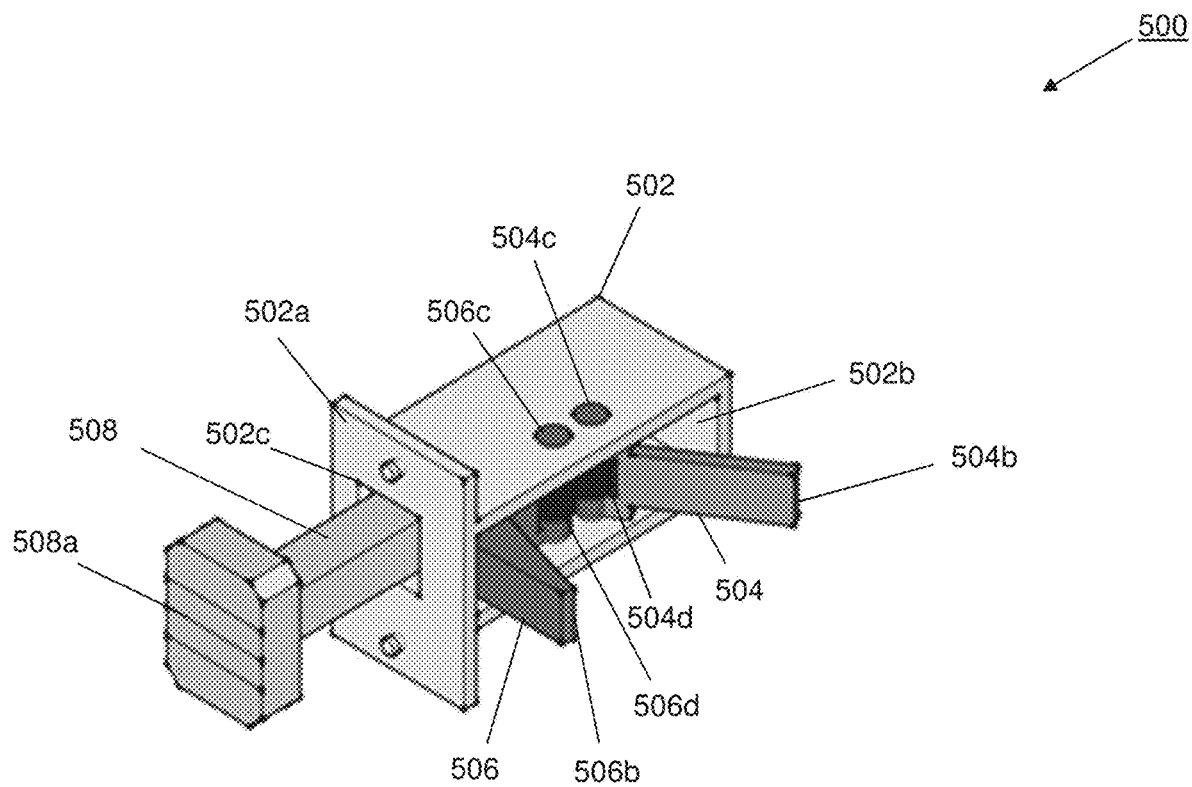
FIG. 5A is a perspective view illustrating an embodiment of a card/chassis release device that may be provided in the card/chassis coupling system of FIGS. 4A and 4B.
Figure 5B:
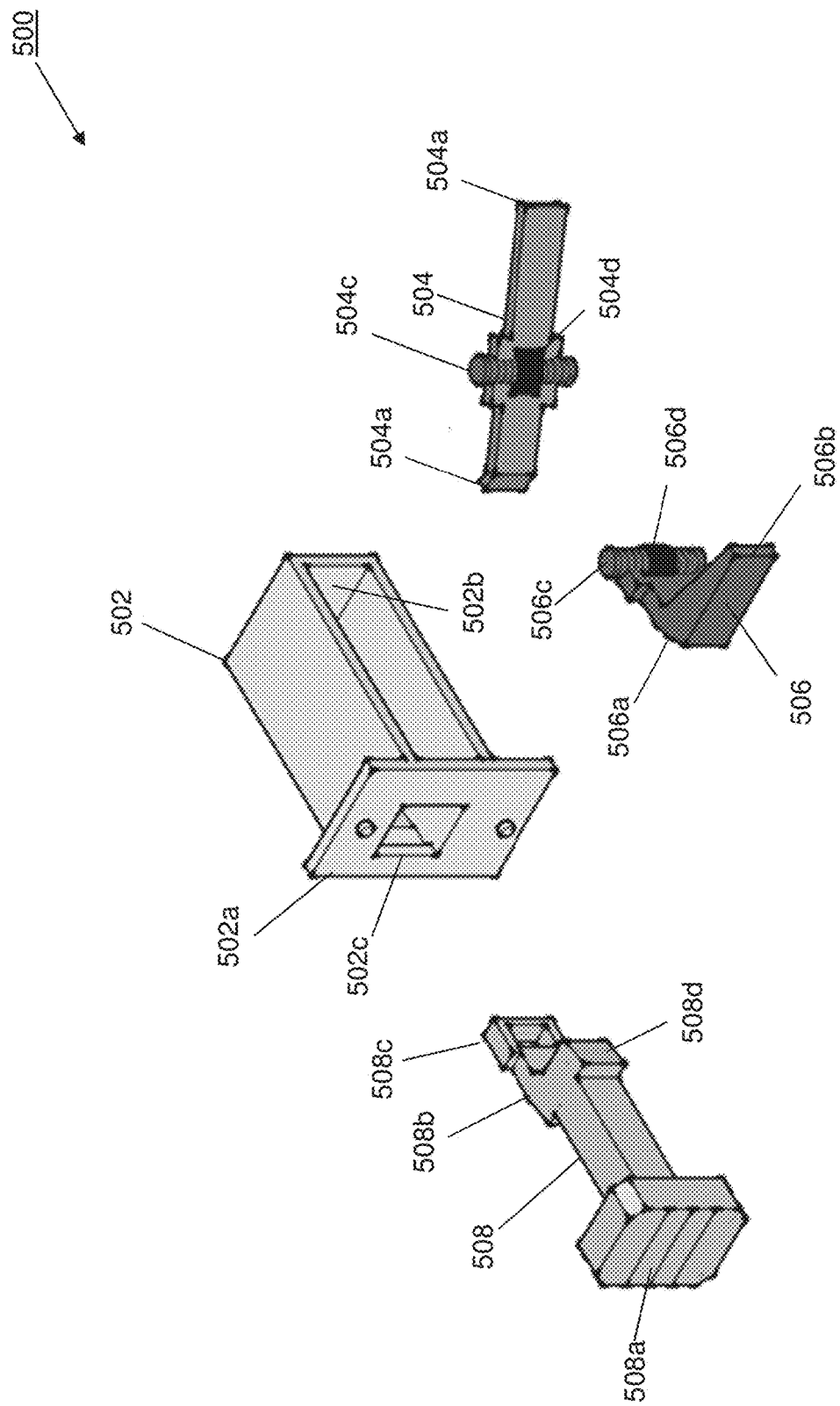
FIG. 5B is an exploded view illustrating an embodiment of a card/chassis release device of FIG. 5B.
Figure 5C:
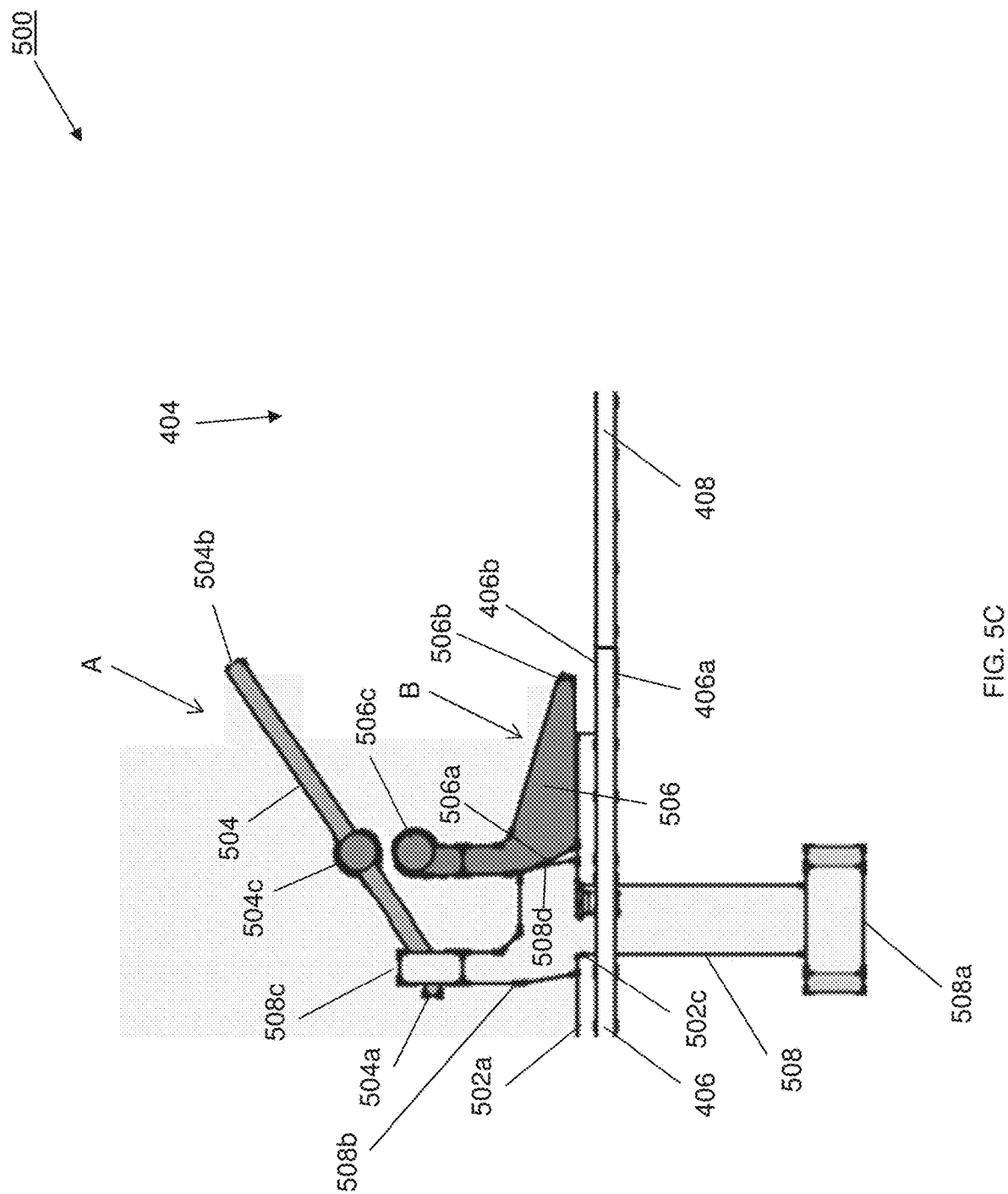
FIG. 5c is an top view illustrating an embodiment of the card/chassis release device of FIGS. 5A and 5B coupled to the chassis of FIGS. 4A and 4B.

Referring now to FIGS. 5A and 5B, an embodiment of a card/chassis release device 500 is illustrated that may be provided in the card/chassis coupling system 400 discussed above with reference to FIGS. 4A and 4B. In the illustrated embodiment, the card/chassis release device 500 includes a base 502 having a mounting plate 502a, with the base 502 defining a base housing 502b that extends along its length and includes a base housing entrance 502c defined by the mounting plate 502. As illustrated in FIG. 5C, the mounting plate 502a on the base 502 may be mounted to the inner surface 406b of the chassis wall 406 (e.g., using screws or other fasteners provided in mounting apertures defined in the mounting plate 502a and in the chassis wall 406.) One of skill in the art in possession of the present disclosure will recognize that the base 502 is omitted from many of the Figures provided herein in order to clearly illustrate the operation of the components of the card/chassis release device 500, and thus would understand that the base 502 extends from the mounting plate 502a and into the chassis housing 404 in FIG. 5C.

The card/chassis release device 500 also includes a card mover member 504 that is located in the base housing 502b defined by the base 502, and that includes an actuator engagement end 504a and a card engagement end 504b located opposite the card mover member 504 from the actuator engagement end 504a. The card mover member 504 is rotatably coupled to the base 502 by a rotatable coupling 504c, and a biasing member 504d (e.g., a spring) is coupled to the rotatable coupling 504c and the card mover member 504 to bias the card mover member 504 into first orientation A illustrated in FIGS. 5A and 5C. The card/chassis release device 500 also includes a securing element release member 506 that is located in the base housing 502b defined by the base 502, and that includes an actuator engagement surface 506a and a securing element engagement end 506b located opposite the securing element release member 506 from the actuator engagement surface 506a. The securing element release member 506 is rotatably coupled to the base 502 by a rotatable coupling 506c, and a biasing member 506d (e.g., a spring) is coupled to the rotatable coupling 506c and the securing element release member 506 to bias the securing element release member 506 into first orientation B illustrated in FIGS. 5A and 5C. While each of the card mover member 504 and the securing element release member 506 are illustrated and described as being rotatably coupled to the base 502, one of skill in the art in possession of the present disclosure will recognize that other movable couplings may be provided for the card mover member 504 and the securing element release member 506 while providing the functionality discussed below, and thus are envisioned as falling within the scope of the present disclosure as well.

The card/chassis release device 500 also includes an actuator member 508 having an actuation surface 508a on a first end of the actuator member 508, and a component activation element 508b on a second end of the actuator member 508 that is opposite the first end of the actuator member 508. The component activation element 508b includes a card mover engagement feature 508c and a securing element release member engagement surface 508d. As can be seen in FIG. 5C, the actuator member 508 is positioned in the base 502 such that the actuator member 508 extend through the base housing entrance 502c and out of the chassis housing 404, with a portion of the actuator member 508 extending from the outer surface 406a of the chassis wall 406 such that the actuation surface 508a is accessible outside the chassis housing 404. Furthermore, the actuator member 508 is coupled to the card mover member 504 via the engagement of the card mover engagement feature 508c and the actuator engagement end 504a on the card mover member 504. The actuator member 508 is also coupled to the securing element release member 506 via the engagement of the securing element release member engagement surface 508d and the actuator engagement surface 506a on the securing element release member 506. However, while a specific card/chassis release device 500 has been illustrated, one of skill in the art in possession of the present disclosure will recognize that card/chassis release devices that operate according to the teachings of the present disclosure may include a variety of components and/or component configurations for providing the functionality discussed below while remaining within the scope of the present disclosure as well.

Figure 6:
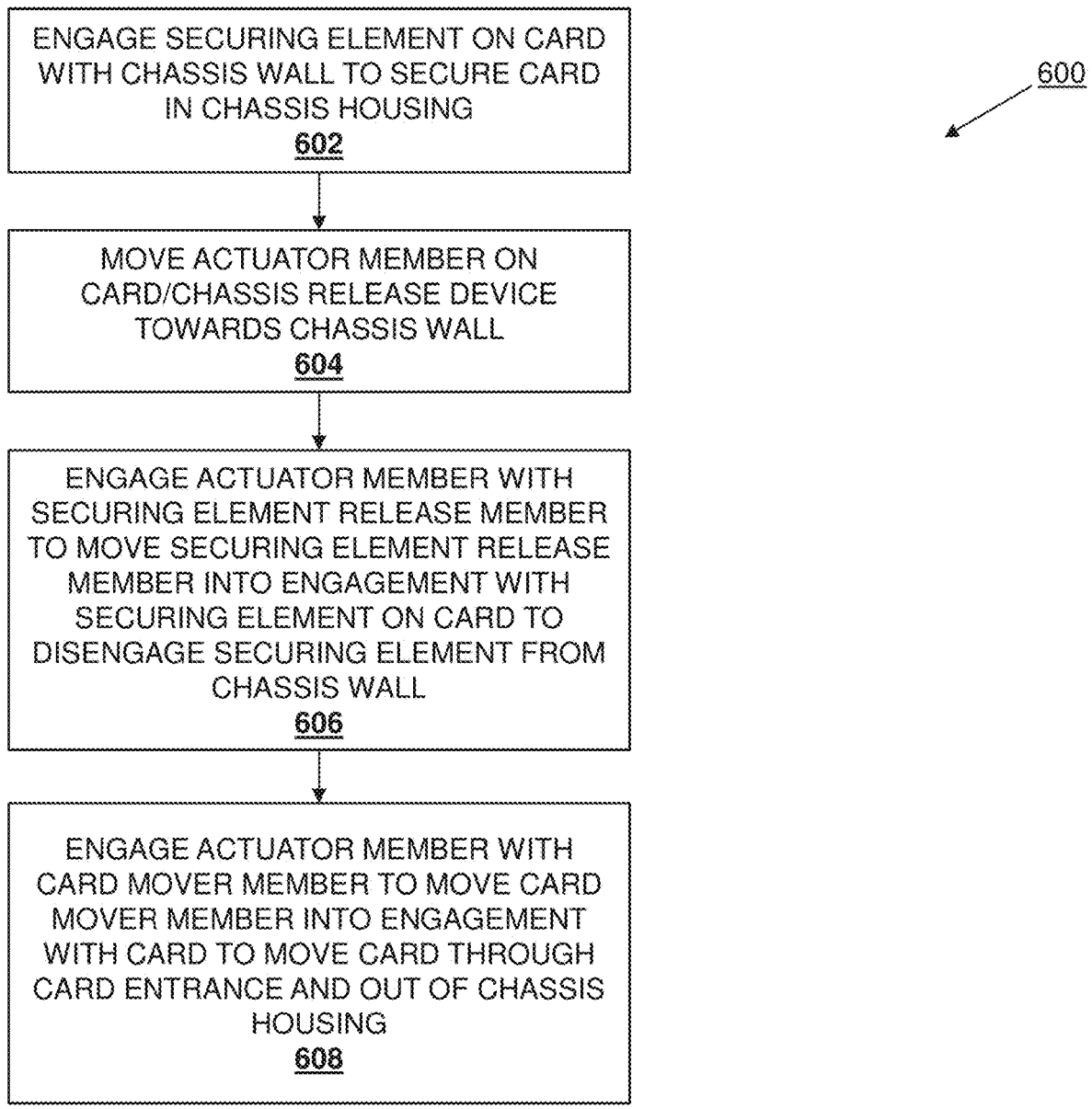
FIG. 6 is a flow chart illustrating an embodiment of a method for coupling a card to a chassis and removing that card from the chassis.

Referring now to FIG. 6, an embodiment of a method 600 coupling a card to a chassis is illustrated. As discussed below, the systems and methods of the present disclosure provide a chassis with card/chassis release device that is relatively easy to actuate even in dense computing device environments that introduce cables and/or other obstructions to the card/chassis release device, and that does not occupy space in front of a card entrance to the chassis, thus allowing a card to be easily provided in and/or remove from the chassis, particularly in the dense computing device environments discussed above. This may be accomplished via a card/chassis release device that is located adjacent the card entrance and that includes a base that is located in the chassis housing. A card mover member is movably coupled to the base, and a securing element release member is moveably coupled to the base adjacent the card mover member An actuator member is coupled to each of the card mover member and the securing element release member, extends through the chassis wall, and is configured, in response to a force that moves the actuator member into the chassis housing when the card is positioned in the chassis housing, to: first cause the securing element release member to move relative to the base and into engagement with the securing element on the card such that the securing element disengages the chassis wall, and then cause the card mover member to move relative to the base and into engagement with the card to move the card through the card entrance and out of the chassis housing. However, while specific components and component configurations for the card/chassis release device are illustrate and described below, a wide variety of component and component configurations are envisioned as falling within the scope of the present disclosure as well.

Figure 7A:
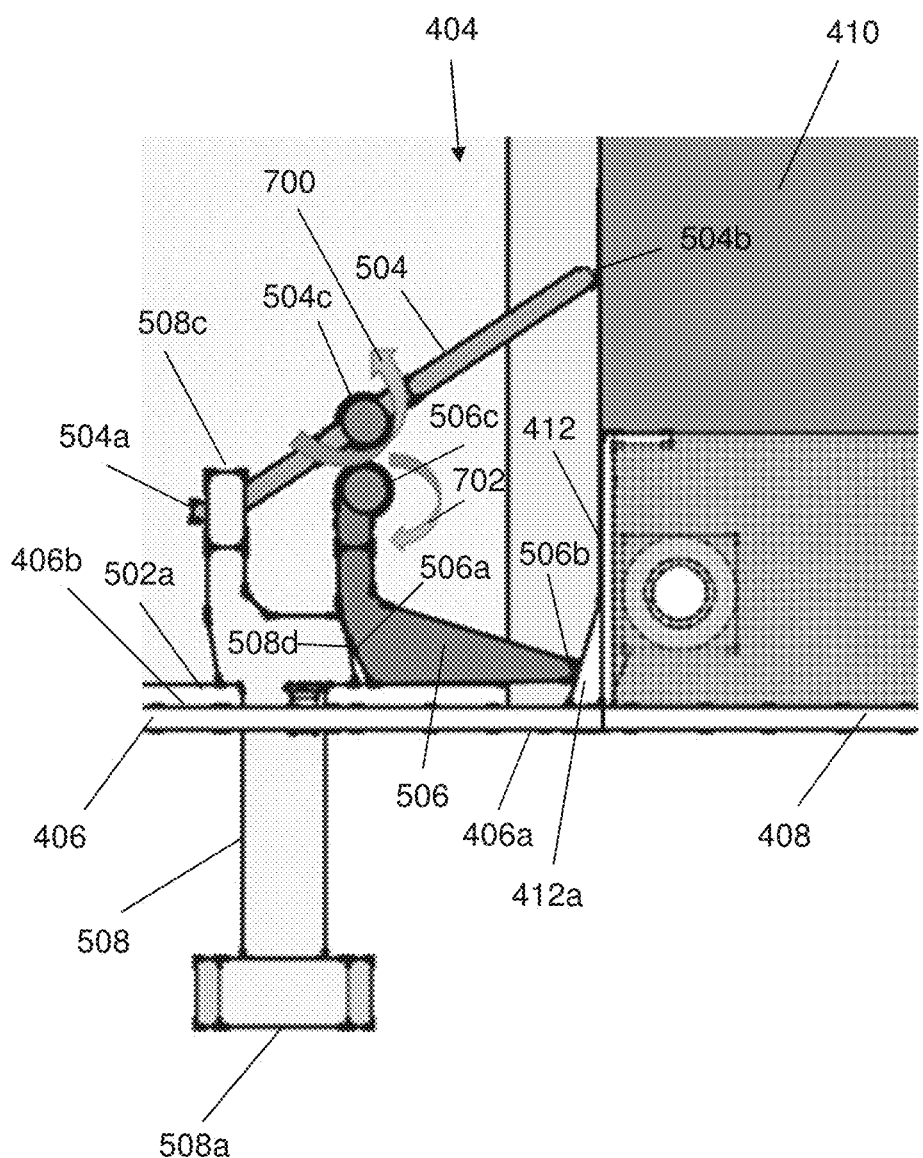
FIG. 7A is a top view illustrating an embodiment of the card secured to the chassis in the card/chassis coupling system of FIGS. 4A and 4B.

The method 600 begins at block 602 where a securing element on a card is engaged with a chassis wall on a chassis to secure the card in a chassis housing defined by the chassis. Similarly as discussed above with reference to FIGS. 4A and 4B, in an embodiment of block 602, the card 410 may be positioned adjacent the card entrance 408 defined by the card wall 406 on the chassis 402, and then moved through the card entrance 408 and into the chassis housing 404 to the position illustrated in FIGS. 4A and 4B. The movement of the card 410 though the card entrance 408 and into the chassis housing 404 causes the securing element engagement member 412a on the securing element 412 to engage the chassis wall 406, which causes the securing element 412 to deflect from an undeflected orientation (which is the same as the orientation illustrated in FIG. 4B when the card is located in the chassis housing 404) and into a deflected orientation that allows the securing element engagement member 412a and the securing element 412, along with the card 410, to pass through the card entrance 408. As can be seen in FIGS. 4A, 4B, and 7A, when the movement of the card 410 though the card entrance 408 and into the chassis housing 404 positions the securing element engagement member 412a past the chassis wall 406 and in the chassis housing 404, the securing element 412 will deflect back into the undeflected orientation illustrated in FIG. 7A such that the securing element engagement member 412a engages the inner surface 406b of the chassis wall 406 to secure the card 410 in the chassis housing 404.

As discussed above with reference to FIG. 5C, a biasing member 504d (e.g., a spring) is coupled to the rotatable coupling 504c and the card mover member 504 on the card/chassis release device 500 to bias the card mover member 504 into the first orientation A illustrated in FIGS. 5A and 5C, and a biasing member 506d (e.g., a spring) is coupled to the rotatable coupling 506c and the securing element release member 506 on the card/chassis release device 500 to bias the securing element release member 506 into the first orientation B illustrated in FIGS. 5A and 5C. FIG. 7A illustrates how the first orientation A of the card mover member 504 is provided by a biasing force 700 and the second orientation B of the securing element release member 506 is provided by a biasing force 702, and one of skill in the art in possession of the present disclosure will appreciate how those biasing forces 700 and 702 ensure that the card mover member 504 and the securing element release member 506 are not in the path of the card 410 when the card 410 is moved into the chassis housing 404 such that the securing of the card 410 in the chassis housing 404 is not obstructed.

FIG. 7A also illustrates how, with the card 410 located in the chassis housing 404, the securing element engagement end 506b on the securing element release member 506 may engage the securing element engagement member 412a on the securing element 412 (although embodiments in which the securing element engagement end 506b does not engage the securing element engagement member 412a when the card 410 is secured in the chassis housing 404 will fall within the scope of the present disclosure as well.) As discussed above, while the operation of a single card/chassis release device 500 has been illustrated and described, FIG. 5 illustrates how two card/chassis release devices 500 may be provided on opposite sides of the card entrance 408, and one of skill in the art in possession of the present disclosure will appreciate that each of the card/chassis release devices 500 may operate substantially as described herein while remaining within the scope of the present disclosure.

As will be appreciated by one of skill in the art in possession of the present disclosure, the securing of the card 410 in the chassis 402/chassis housing 408 may connect the card 410 to components housed in the chassis housing 404 of the chassis 402 (e.g., to a processing system, such as the processor 102 discussed above with reference to FIG. 2, and via a card connector included in the chassis 402, not illustrated.) As such, following the securing of the card 410 in the chassis 402/chassis housing 408 at block 602, the functionality provided by the card 410 may be utilized by a processing system in the chassis 402 to perform a variety of operations that would be apparent to one of skill in the art in possession of the present disclosure. In a specific example, the card 410 is an OCP NIC 3.0 card, and following block 602 the processing system in the chassis housing 404 of the chassis 402 may perform networking operations using that OCP NIC 3.0 card.

Figure 7B:
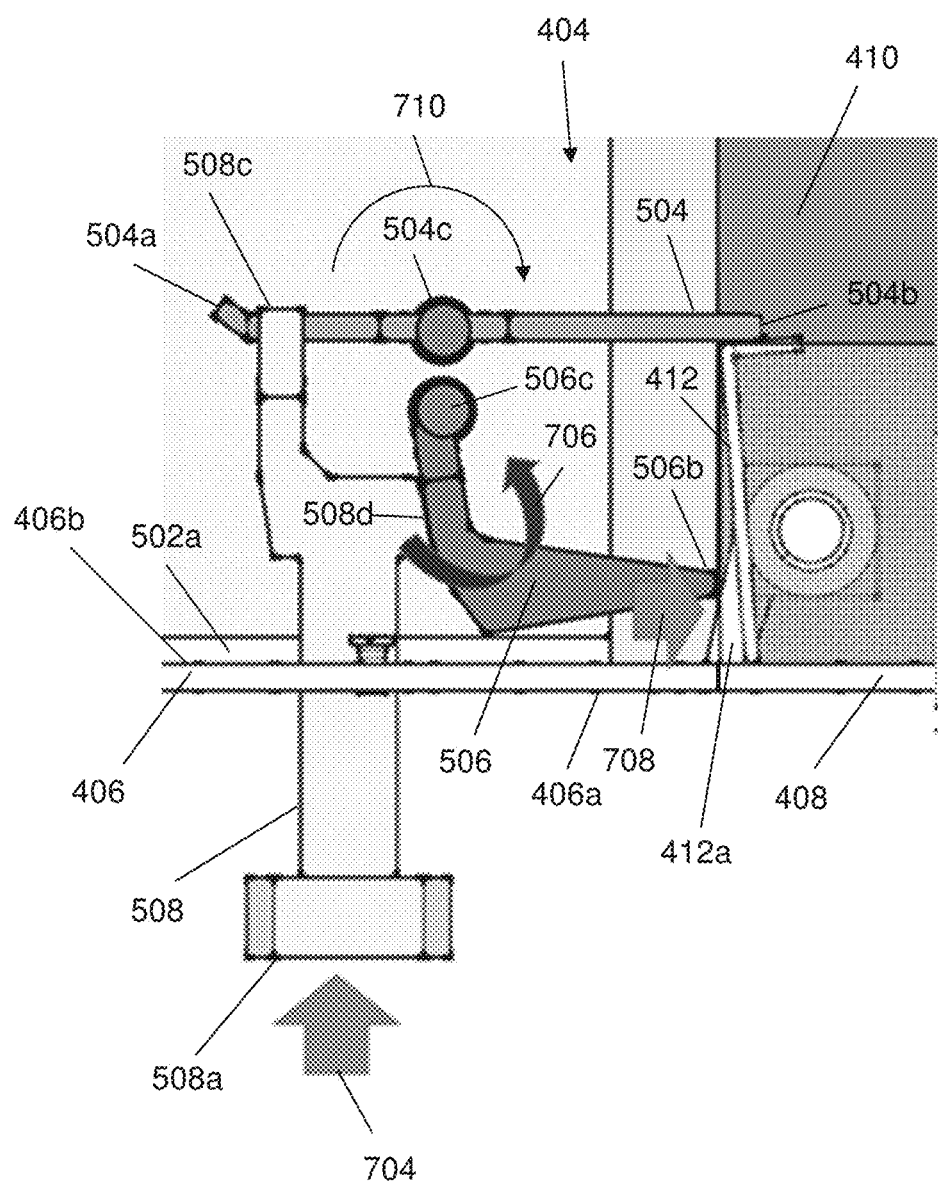
FIG. 7B is a top view illustrating an embodiment of the card being released from the chassis in the card/chassis coupling system of FIGS. 4A and 4B using the card/chassis release device of FIGS. 5A and 5B.

The method 600 then proceeds to block 604 where an actuator member on a card/chassis release device is moved towards the chassis wall. In an embodiment, at some point following block 602, a user of the chassis 402 may wish to remove the card 410 from the chassis 402. For example, removal of the card 410 from the chassis 402 may be performed to replace the card 410, repair the card 410, inspect the card 410, and/or for any other card removal reasons that would be apparent to one of skill in the art in possession of the present disclosure. As such, in an embodiment of block 604, the user may provide a force on the actuator member 508 included on the card/chassis release device 500 to move that actuator member 508 towards the chassis wall 406. With reference to FIG. 7B, a force 704 is illustrated being provided on the actuation surface 508a of the actuator member 508 that one of skill in the art in possession of the present disclosure will appreciate will move the actuation surface 508a on the actuation member 508 towards the outer surface 406a of the chassis wall 406, as well as move the actuator member 508 into the chassis housing 404.

The method 600 then proceeds to block 606 where the actuator member engages with a securing element release member to move the securing element release member into engagement with the securing element on the card to disengage the securing element from the chassis wall. As illustrated in FIG. 7B, in an embodiment of block 606 and due to the engagement of the engagement surface 508d on the card mover member 500 and the actuator engagement surface 506a on the securing element release member 506, the movement of the actuator member 508 into the chassis housing 404 will overcome the biasing force 702 provided by the biasing member 506d and cause the securing element release member 506 to rotate in a direction 706 about its rotatable coupling 506c such that the securing element engagement end 506b on the securing element release member 506 engages the securing element engagement member 412a to move the securing element 412 in a direction 708 and from the undeflected orientation illustrated in FIG. 7A to a deflected orientation illustrated in FIG. 7B. As will be appreciated by one of skill in the art in possession of the present disclosure, the movement of the securing element 412 to the deflected orientation may be configured such that the securing element engagement member 412a on the securing element 412 moves in the direction 708 until it "clears" the chassis wall 406 in a manner that allows the securing element 412 to move through the chassis entrance 408, discussed in further detail below.

Figure 7C:
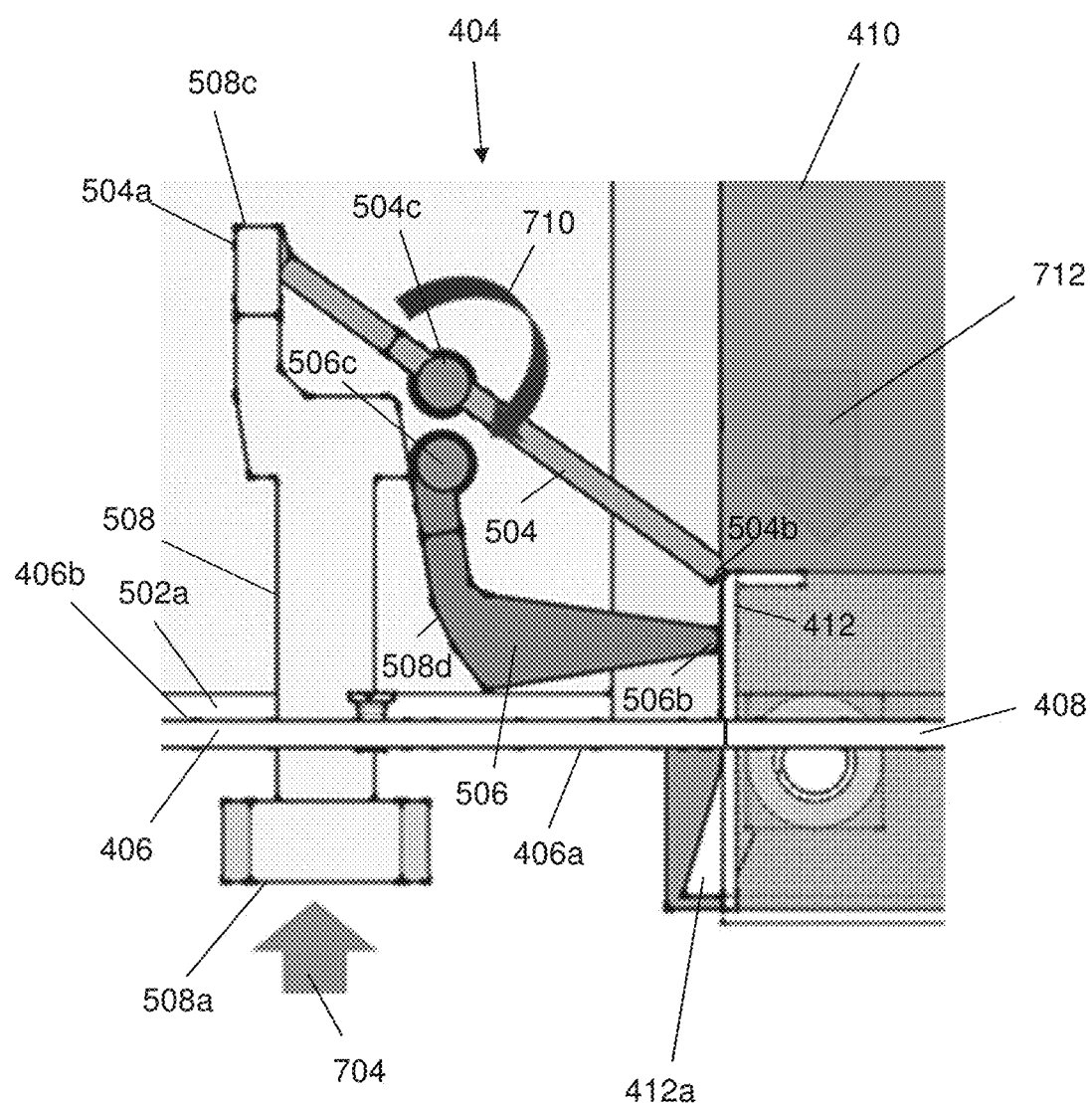
FIG. 7C is a top view illustrating an embodiment of the card being released from the chassis in the card/chassis coupling system of FIGS. 4A and 4B using the card/chassis release device of FIGS. 5A and 5B.

The method 600 then proceeds to block 608 where the actuator member engages with a card mover member to move the card mover member into engagement with the card to move the card through the card entrance and out of the chassis housing. As also illustrated in FIG. 7B, in an embodiment of block 608 and due to the engagement of the card mover engagement feature 508c on the actuator member 508 and the actuator engagement end 504a on the card mover member 504, the force 704 provided on the actuation surface 508a of the actuator member 508 that moves the actuator member 508 into the chassis housing 404 will also overcome the biasing force 700 provided by the biasing member 504d and cause the card mover member 504 to rotate in a direction 710 about its rotatable coupling 504c such that the card engagement end 504b on the card mover member 504 engages the card 410. As illustrated in FIG. 7C, continued provisioning of the force 704 will continue to move the actuator member 508 into the chassis housing 404, thus causing further rotation of the card mover member 504 in the direction 710, and the continued engagement of the card engagement end 504b on the card mover member 504 with the card 410 will provide a force 712 on the card 410 that moves the card 410 through the card entrance 408 and out of the chassis housing 404.

As will be appreciated by one of skill in the art in possession of the present disclosure, the engagement of the securing element release member 506 and the securing element 412 to move the securing element 412 to the deflected orientation such that the securing element engagement member 412a on the securing element 412 "clears" the chassis wall 406 will allow the force 712 on the card 410 to move the card 410 through the card entrance 408 and out of the chassis housing 404 (i.e., without the securing element 412 engaging the chassis wall 406 to resist that movement.) Furthermore, the movement of the card 410 out of the chassis housing 404 may disconnect the card 410 from a connector (not illustrated) in the chassis housing 404, which allows the card 410 to be removed completely from the chassis 402/chassis housing 404 for replacement, repair, inspection, and/or any other reason that would be apparent to one of skill in the art in possession of the present disclosure.

Thus, systems and methods have been described that provide a card/chassis release device that is located adjacent a card entrance and that includes a base that is located in a chassis housing. A card mover member is movably coupled to the base, and a securing element release member is moveably coupled to the base adjacent the card mover member. An actuator member is coupled to each of the card mover member and the securing element release member, extends through the chassis wall, and is configured, in response to a force that moves the actuator member into the chassis housing when the card is positioned in the chassis housing, to: first cause the securing element release member to move relative to the base and into engagement with the securing element on the card such that the securing element disengages the chassis wall, and then cause the card mover member to move relative to the base and into engagement with the card to move the card through the card entrance and out of the chassis housing. As such, a card/chassis release device on a chassis is provided that is relatively easy to actuate even in dense computing device environments that introduce cables and/or other obstructions to the card/chassis release device, and that does not occupy space in front of a card entrance to the chassis, thus allowing cards such as OCP cards to be easily provided in and/or remove from the chassis, particularly in the dense computing device environments discussed above.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A card/chassis coupling system, comprising:
   a chassis that defines a chassis housing;
   a chassis wall that is included on the chassis and that defines a card entrance to the chassis housing, wherein the chassis wall is configured to engage a first securing element on a card to secure the card in the chassis housing; and
   a first card/chassis release device that is located adjacent the card entrance, wherein the first card/chassis release device includes:
   a first base that is located in the chassis housing;
   a first card mover member that is movably coupled to the first base;
   a first securing element release member that is moveably coupled to the first base adjacent the first card mover member; and
   a first actuator member that is coupled to each of the first card mover member and the first securing element release member, wherein the first actuator member extends through the chassis wall and is configured, in response to a first force that moves the first actuator member into the chassis housing when the card is positioned in the chassis housing, to:
   first cause the first securing element release member to move relative to the first base and into engagement with the first securing element on the card such that the first securing element disengages the chassis wall; and
   then cause the first card mover member to move relative to the first base and into engagement with the card to move the card through the card entrance and out of the chassis housing.

2. The system of claim 1, further comprising:
   a second card/chassis release device that is located adjacent the card entrance and opposite the card entrance from the first card/chassis release device, wherein the second card/chassis release device includes:
   a second base that is located in the chassis housing;
   a second card mover member that is movably coupled to the second base;
   a second securing element release member that is moveably coupled to the second base adjacent the second card mover member; and
   a second actuator member that is coupled to each of the second card mover member and the second securing element release member, wherein the second actuator member extends through the chassis wall and is configured, in response to a second force that moves the second actuator member into the chassis housing when the card is positioned in the chassis housing, to:
  first cause the second securing element release member to move relative to the second base and into engagement with the second securing element on the card such that the second securing element disengages the chassis wall; and
  then cause the second card mover member to move relative to the second base and into engagement with the card to move the card through the card entrance and out of the chassis housing.

3. The system of claim 1, wherein the first securing element release member is rotatably coupled to the first base by a rotatable coupling, and wherein the movement of first actuator member into the chassis housing causes an engagement of the first actuator member and the first securing element release member to rotate the first securing element release member about the rotatable coupling and into engagement with the first securing element on the card such that the first securing element disengages the chassis wall.

4. The system of claim 3, further comprising:
  a biasing member that is provided on the first securing element release member and that is configured to bias the first securing element release member to resist rotation about the rotatable coupling and into engagement with the first securing element on the card.

5. The system of claim 1, wherein the first card mover member is rotatably coupled to the first base by a rotatable coupling, and wherein the movement of first actuator member into the chassis housing causes an engagement of the first actuator member and the first card mover member to rotate the first card mover member about the rotatable coupling and into engagement with the card to move the card through the card entrance and out of the chassis housing.

6. The system of claim 5, further comprising:
  a biasing member that is provided on the first card mover member and that is configured to bias the first card mover member to resist rotation about the rotatable coupling and into engagement with the card.

7. An Information Handling System (IHS), comprising: a chassis defining a chassis housing; a processing system that is located in the chassis housing; a chassis wall that is included on the chassis and that defines a card entrance to the chassis housing; a card that is located in the chassis housing and coupled to the processing system, wherein the chassis wall engages a first securing element on the card to secure the card in the chassis housing; and a first card/chassis release device that is located adjacent the card entrance, wherein the first card/chassis release device includes: a first base that is located in the chassis housing; a first card mover member that is movably coupled to the first base; a first securing element release member that is moveably coupled to the first base adjacent the first card mover member; and a first actuator member that is coupled to each of the first card mover member and the first securing element release member, wherein the first actuator member extends through the chassis wall and is configured, in response to a first force that moves the first actuator member into the chassis housing, to: first cause the first securing element release member to move relative to the first base and into engagement with the first securing element on the card such that the first securing element disengages the chassis wall; and then cause the first card mover member to move relative to the first base and into engagement with the card to move the card through the card entrance and out of the chassis housing.

8. The IHS of claim 7, further comprising:
  a second card/chassis release device that is located adjacent the card entrance and opposite the card entrance from the first card/chassis release device, wherein the second card/chassis release device includes:
    a second base that is located in the chassis housing;
    a second card mover member that is movably coupled to the second base;
    a second securing element release member that is moveably coupled to the second base adjacent the second card mover member; and
    a second actuator member that is coupled to each of the second card mover member and the second securing element release member, wherein the second actuator member extends through the chassis wall and is configured, in response to a second force that moves the second actuator member into the chassis housing when the card is positioned in the chassis housing, to:
      first cause the second securing element release member to move relative to the second base and into engagement with the second securing element on the card such that the second securing element disengages the chassis wall; and
      then cause the second card mover member to move relative to the second base and into engagement with the card to move the card through the card entrance and out of the chassis housing.

9. The IHS of claim 7, wherein the first securing element release member is rotatably coupled to the first base by a rotatable coupling, and wherein the movement of first actuator member into the chassis housing causes an engagement of the first actuator member and the first securing element release member to rotate the first securing element release member about the rotatable coupling and into engagement with the first securing element on the card such that the first securing element disengages the chassis wall.

10. The IHS of claim 9, further comprising:
  a biasing member that is provided on the first securing element release member and that is configured to bias the first securing element release member to resist rotation about the rotatable coupling and into engagement with the first securing element on the card.

11. The IHS of claim 7, wherein the first card mover member is rotatably coupled to the first base by a rotatable coupling, and wherein the movement of first actuator member into the chassis housing causes an engagement of the first actuator member and the first card mover member to rotate the first card mover member about the rotatable coupling and into engagement with the card to move the card through the card entrance and out of the chassis housing.

12. The IHS of claim 11, further comprising:
  a biasing member that is provided on the first card mover member and that is configured to bias the first card mover member to resist rotation about the rotatable coupling and into engagement with the card.

13. The IHS of claim 7, wherein the card is a Network Interface Controller (NIC) card.

14. A method for coupling a card to a chassis, comprising: engaging, by a chassis wall that is included on the chassis, a first securing element on the card that has been moved through a chassis entrance defined by the chassis and into a chassis housing defined by the chassis, wherein the engagement of the chassis wall and the first securing element secures the card in the chassis housing; moving, in response to a first force, a first actuator member that extends through the chassis wall and that is included on a first card/chassis release device that is located adjacent the card entrance and that includes a first base that is located in the chassis housing; first causing, in response to the movement of the first actuator member, a first securing element release member that is movably coupled to the first base to move relative to the first base and into engagement with the first securing element on the card such that the first securing element disengages the chassis wall; and then causing, in response to the movement of the first actuator member, a first card mover member that is movably coupled to the first base to move relative to the first base and into engagement with the card to move the card through the card entrance and out of the chassis housing.

15. The method of claim 14, further comprising:
moving, in response to a second force, a second actuator member that extends through the chassis wall and that is included on a second card/chassis release device that is located adjacent the card entrance and opposite the card entrance from the first card/chassis release device and that includes a second base that is located in the chassis housing;
first causing, in response to the movement of the second actuator member, a second securing element release member that is movably coupled to the second base to move relative to the second base and into engagement with the second securing element on the card such that the second securing element disengages the chassis wall; and
then causing, in response to the movement of the second actuator member, a second card mover member that is movably coupled to the second base to move relative to the second base and into engagement with the card to move the card through the card entrance and out of the chassis housing.

16. The method of claim 14, wherein the first securing element release member is rotatably coupled to the first base by a rotatable coupling, and wherein the movement of first actuator member into the chassis housing causes an engagement of the first actuator member and the first securing element release member to rotate the first securing element release member about the rotatable coupling and into engagement with the first securing element on the card such that the first securing element disengages the chassis wall.

17. The method of claim 14, further comprising:
biasing, via a biasing member that is provided on the first securing element release member, the first securing element release member to resist rotation about the rotatable coupling and into engagement with the first securing element on the card.

18. The method of claim 14, wherein the first card mover member is rotatably coupled to the first base by a rotatable coupling, and wherein the movement of first actuator member into the chassis housing causes an engagement of the first actuator member and the first card mover member to rotate the first card mover member about the rotatable coupling and into engagement with the card to move the card through the card entrance and out of the chassis housing.

19. The method of claim 14, further comprising:
biasing, by a biasing member that is provided on the first card mover member, the first card mover member to resist rotation about the rotatable coupling and into engagement with the card.

20. The method of claim 14, wherein the card is a Network Interface Controller (NIC) card.

* * * * *